(12) United States Patent
Singh et al.

(10) Patent No.: US 10,593,754 B2
(45) Date of Patent: Mar. 17, 2020

(54) SOI DEVICE STRUCTURES WITH DOPED REGIONS PROVIDING CHARGE SINKING

(71) Applicant: GLOBALFOUNDRIES Inc., Grand Cayman (KY)

(72) Inventors: Jagar Singh, Clifton Park, NY (US); Jerome Ciavatti, Mechanicville, NY (US); Jae Gon Lee, Waterford, NY (US); Josef Watts, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/045,267

(22) Filed: Jul. 25, 2018

(65) Prior Publication Data

US 2020/0035785 A1    Jan. 30, 2020

(51) Int. Cl.
*H01L 21/265*    (2006.01)
*H01L 29/06*    (2006.01)
*H01L 21/762*    (2006.01)

(52) U.S. Cl.
CPC ........ *H01L 29/0653* (2013.01); *H01L 21/265* (2013.01); *H01L 21/76267* (2013.01); *H01L 21/76283* (2013.01)

(58) Field of Classification Search
CPC ............... H01L 29/0653; H01L 21/265; H01L 21/76267; H01L 21/76283

USPC .......................................................... 257/347
See application file for complete search history.

(56) References Cited

U.S. PATENT DOCUMENTS

| 6,465,830 | B2 | 10/2002 | Babcock et al. | |
|---|---|---|---|---|
| 8,357,973 | B2 | 1/2013 | Lui et al. | |
| 8,680,615 | B2 | 3/2014 | Mitra et al. | |
| 2012/0168863 | A1* | 7/2012 | Zhu | H01L 21/84 257/347 |
| 2012/0261792 | A1* | 10/2012 | Cheng | H01L 21/84 257/510 |
| 2013/0175594 | A1* | 7/2013 | Basker | H01L 21/84 257/301 |
| 2013/0178043 | A1* | 7/2013 | Cheng | H01L 21/84 438/400 |

* cited by examiner

*Primary Examiner* — Matthew C Landau
*Assistant Examiner* — Dmitriy Yemelyanov
(74) *Attorney, Agent, or Firm* — Thompson Hine LLP

(57) ABSTRACT

Semiconductor structures and methods of forming semiconductor structures. Trench isolation regions arranged to surround an active device region The trench isolation regions extend through a device layer and a buried oxide layer of a silicon-on-insulator wafer into a substrate of the silicon-on-insulator wafer. A well is arranged in the substrate outside of the trench isolation regions, and a doped region is arranged in a portion of the substrate. The doped region is arranged in a portion of the substrate that is located in a horizontal direction adjacent to one of the trench isolation regions and in a vertical direction adjacent to the buried oxide layer. The doped region and the well have the same conductivity type.

19 Claims, 3 Drawing Sheets

SOI DEVICE STRUCTURES WITH DOPED REGIONS PROVIDING CHARGE SINKING

BACKGROUND

The present invention relates to semiconductor device fabrication and integrated circuits and, more specifically, to semiconductor structures and methods of forming semiconductor structures.

Devices fabricated using silicon-on-insulator technologies may exhibit certain performance improvements in comparison with comparable devices built directly in a bulk silicon substrate. Generally, a silicon-on-insulator wafer includes a thin device layer composed of a semiconductor material, a substrate, and a buried oxide layer physically separating and electrically isolating the device layer from the substrate.

Device structures for a field-effect transistor generally include a source, a drain, and a gate electrode configured to switch carrier flow in a channel region arranged between the source and drain. The channel region of a planar field-effect transistor is located beneath the top surface of a substrate on which the gate electrode is arranged. When a control voltage exceeding a designated threshold voltage is applied to the gate electrode, carrier flow occurs in the channel region to produce a device output current.

Field-effect transistors fabricated by complementary metal-oxide semiconductor processes also include n-type and p-type wells that are formed by ion implantation in the substrate. A BFMOAT is another type of region that may be formed in the substrate and from which the implants forming the wells are blocked. The substrate region retains its original conductivity type (e.g., lightly-doped p-type silicon) over the BFMOAT and has a high electrical resistivity in comparison with the semiconductor material of the wells. During device operation, the BFMOAT may operate to minimize substrate coupling and/or to improve the signal-to-noise ratio. However, during high current drive operation, the device output current may drop due to charge accumulation in the substrate at and near the interface with the buried oxide layer.

Improved semiconductor structures and methods of forming semiconductor structures are needed.

SUMMARY

In an embodiment of the invention, a structure includes a plurality of trench isolation regions arranged to surround an active device region The trench isolation regions extend through a device layer and a buried oxide layer of a silicon-on-insulator wafer into a substrate of the silicon-on-insulator wafer. The structure further includes a well arranged in the substrate outside of the trench isolation regions, and a doped region arranged in a portion of the substrate that is located in a horizontal direction adjacent to one of the trench isolation regions and in a vertical direction adjacent to the buried oxide layer the doped region. The doped region and the well have the same conductivity type.

In an embodiment of the invention, a method includes forming a plurality of trench isolation regions arranged to surround an active device region. The trench isolation regions extend through a device layer and a buried oxide layer of a silicon-on-insulator wafer into a substrate of a silicon-on-insulator wafer. The method further includes forming a well arranged in the substrate outside of the trench isolation regions, and forming a doped region that is arranged in a portion of the substrate located in a horizontal direction adjacent to one of the trench isolation regions and in a vertical direction adjacent to the buried oxide layer. The doped region and the well have the same conductivity type.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 3A is a top view of the structure in which FIG. 3 is taken generally along line 3-3.

DETAILED DESCRIPTION

Figure 1:
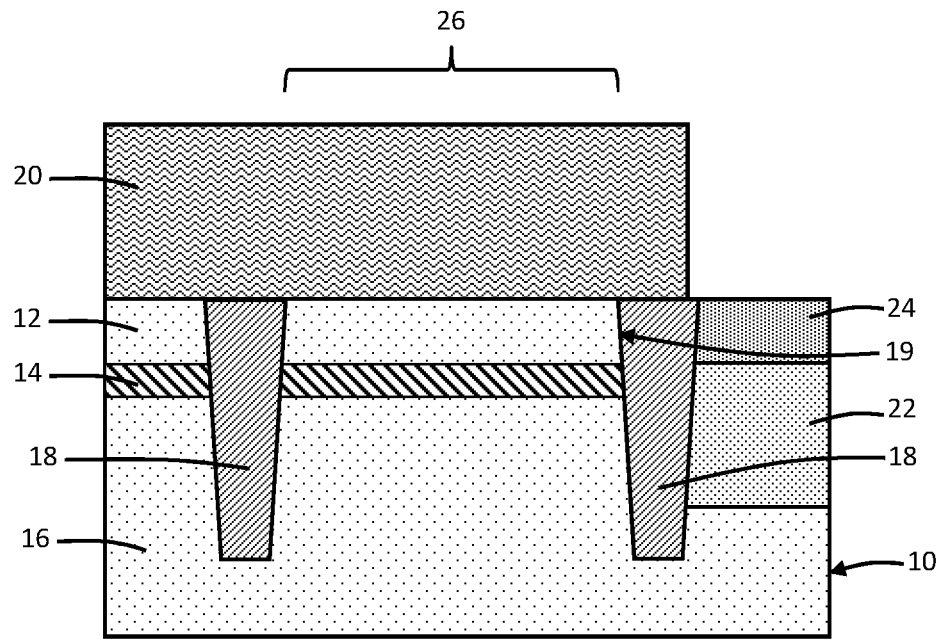
FIG. 1 is a top view of a structure at an initial stage of a processing method in accordance with embodiments of the invention.

With reference to FIG. 1 and in accordance with an embodiment of the invention, a semiconductor wafer 10 may be a semiconductor-on-insulator (SOI) wafer that includes a device layer 12, a buried oxide (BOX) layer 14, and a substrate 16. The device layer 12 is separated from the substrate 16 by the intervening BOX layer 14 and may be considerably thinner than the substrate 16. The device layer 12 is arranged over the BOX layer 14 and is electrically insulated from the substrate 16 by the BOX layer 14. The BOX layer 14 may be composed of an electrical insulator, such as silicon dioxide (e.g., $SiO_2$). The device layer 12 and the substrate 16 may be composed of a single-crystal semiconductor material, such as single-crystal silicon (Si). In one embodiment, the device layer 12 may be extremely thin (i.e., a thickness of 2 nanometers (nm) to 15 nm), which is characteristic of an extremely-thin-silicon-on-insulator (ET-SOI) substrate that may be used to manufacture fully-depleted SOI devices (FDSOI). The substrate 16, prior to being processed, may be lightly-doped with a p-type dopant from Group V of the Periodic Table (e.g., boron (B) and/or indium (In)) that provides p-type electrical conductivity.

Trench isolation regions 18 are formed that extend from a top surface of the device layer 12 through the BOX layer 14 and to a given depth in the substrate 16. The trench isolation regions 18 may be formed with a lithography and etching process forming a pattern of trenches in the semiconductor wafer 10, followed by filling the trenches with a dielectric material, such as an oxide of silicon (e.g., silicon dioxide ($SiO_2$)), deposited by chemical vapor deposition (CVD), planarization with chemical mechanical polishing (CMP), and recessing with a de-glaze process. The trench isolation regions 18, which may be trapezoidal in shape, surround an active device region 19 of the device layer 12. A portion of the BOX layer 14 extends laterally between the trench isolation regions 18, and is arranged in a vertical direction between the active device region 19 and the substrate 16 beneath the laterally-extending portion of the BOX layer 14.

An implantation mask 20 is formed over the active device region and overlaps at its outer edge with the trench isolation regions 18. After forming the implantation mask 20, a well 22 is formed in the substrate 16 of the semiconductor wafer 10. The well 22 may be doped to have the same conductivity type as the substrate 16 and, in that regard, the well 22 may contain p-type dopant from Group V of the Periodic Table (e.g., boron (B) and/or indium (In)) that provides p-type electrical conductivity. The well 22 may be formed by applying the implantation mask 20 and implanting with ions delivering the p-type dopant under given implantation conditions (e.g., ion species, dose, kinetic energy, implantation angle). The ions used to form the well 22 may be generated from a suitable source gas and implanted into the substrate 16 with the given implantation conditions using an ion implantation tool. An anneal may be used to activate and/or drive-in the dopants of the well 22.

The implantation mask 20 has a thickness and stopping power that prevent the ions from penetrating through the implantation mask 20 and reaching the active device region 19. As a result, a blocked region 26, also known as a BFMOAT region, is defined in the substrate 16 and is arranged beneath the active device region 19 generally inside the inner boundary of the trench isolation regions 18. The blocked region 26 is separated and electrically isolated from the active device region 19 by a section of the BOX layer 14. The blocked region 26 has an electrical resistivity that is greater than the electrical resistivity of the well 22, and that may be equal to the electrical resistivity of the substrate 16.

A well contact 24 connected with the well 22 may be formed outside of the trench isolation regions 18. The well contact 24 has the same conductivity type as the well 22 and, in an embodiment, the well contact 24 may contain a p-type dopant and may be heavily doped. The well contact 24 may be formed by removing the device layer 12 and BOX layer 14 over a section of the wafer 10 outside of the trench isolation regions 18 and then refilling with a doped epitaxial semiconductor material to restore planarity. The epitaxial semiconductor material may be in situ doped during epitaxial growth or may be ion implanted after growth. The well contact 24 may instead be formed directly in the substrate 16, after removing the device layer 12 and BOX layer 14 over the section of the wafer 10 outside of the trench isolation regions 18, by ion implantation and therefore may be recessed relative to the device layer 12. If the well contact 24 is formed using ion implantation, an implantation mask is used to block the implantation of the blocked region 26.

Additional ion implantations may be done to form one or more additional wells (not shown), such as one or more wells having an opposite conductivity type (i.e., n-type electrical conductivity) from the well 22 as found in CMOS technologies. Prior to each implantation, the implantation mask 20 or a similar implantation mask is provided over the active device region 19 such that the blocked region 26 is shielded and does not receive a dose of the implanted ions.

Figure 2:
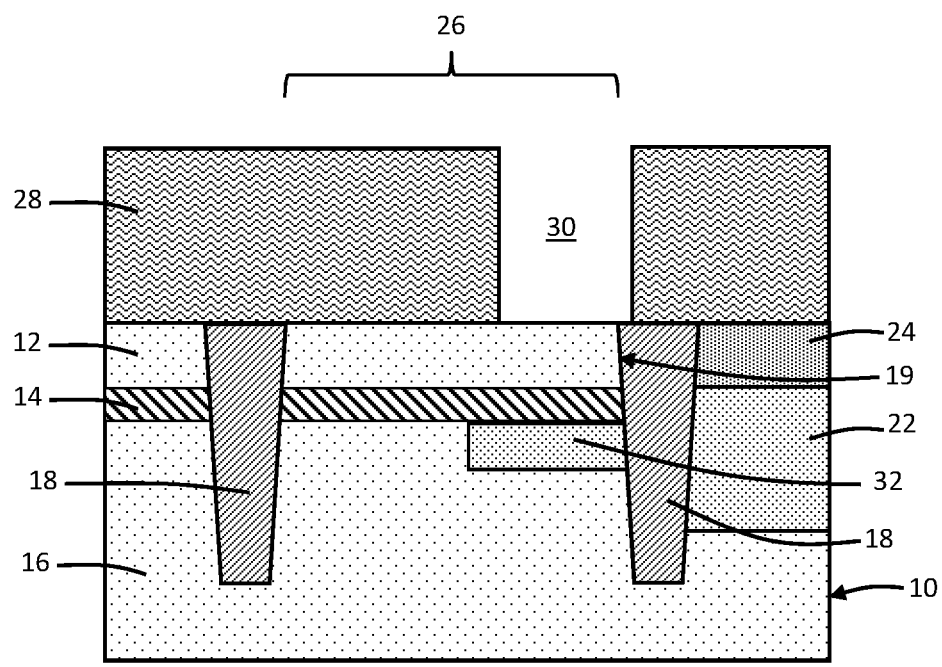
FIG. 2 is a cross-sectional view taken generally along line 2-2 in FIG. 1.

With reference to FIG. 2 in which like reference numerals refer to like features in FIG. 1 and at a subsequent fabrication stage, an implantation mask 28 is formed that includes an opening 30 arranged over the active device region 19 and the underlying blocked region 26 of the substrate 16. A doped region 32 is formed in the blocked region 26 of the substrate 16 beneath the active device region 19 and the laterally-extending portion of the BOX layer 14. The doped region 32 may be arranged in the blocked region 26 adjacent to one of the trench isolation regions 18. In an embodiment, the doped region 32 is arranged in its entirety in the blocked region 26 of the substrate 16 interior of the trench isolation regions 18. In an embodiment, the doped region 32 is arranged at a given depth in the substrate 16 such that the doped region 32 is separated in its entirety from the active device region 19 by a portion of the BOX layer 14. The intervening laterally-extending portion of the BOX layer 14 electrically isolates the doped region 32 from the active device region 19.

In the representative embodiment, the doped region 32 is formed in the blocked region 26 of the substrate 16 after the formation of the trench isolation regions 18. In an alternative embodiment, the doped region 32 may be formed in the blocked region 26 of the substrate 16 before the formation of the trench isolation regions 18.

The doped region 32 may be doped to have the same conductivity type as the substrate 16 and, in that regard, the doped region 32 may contain p-type dopant from Group V of the Periodic Table (e.g., boron (B) and/or indium (In)) that provides p-type electrical conductivity. The doped region 32 may be formed by applying the implantation mask 28 and implanting with ions delivering the p-type dopant under given implantation conditions (e.g., ion species, dose, kinetic energy, implantation angle). To form the doped region 32, the ions may be generated from a suitable source gas and implanted into the substrate 16 with the given implantation conditions using an ion implantation tool. The implantation conditions are chosen such that the depth profile of the implanted ions is located in the substrate 16 in close proximity to the BOX layer 14. An anneal may be used to activate and/or drive-in the dopants of the doped region 32.

The implantation mask 28 may include a layer of a light-sensitive material, such as an organic photoresist, applied by a spin coating process, pre-baked, exposed to light projected through a photomask, baked after exposure, and developed with a chemical developer to form an opening at the intended location for the doped region 32. The implantation mask 28 may also include an anti-reflective coating and/or a spin-on hardmask, such as an organic planarization layer (OPL), that are patterned along with the photoresist. The implantation mask 28 is parameterized (e.g., thickness and material) to provide a stopping power that is sufficient to prevent the energetic ions implanted to form the doped region 32 from penetrating into the covered sections of the active device region 19 and altering their conductivity. The area of the active device region 19 that is implanted with the ions forms the doped region 32.

Figure 3:
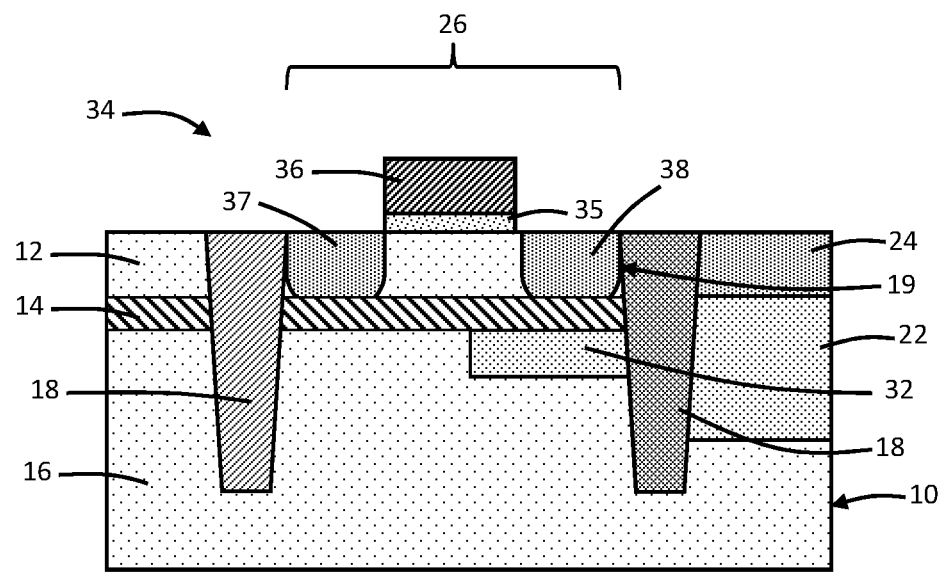
FIG. 3 is a cross-sectional view of the structure at a subsequent stage of the processing method.
Figure 3A:
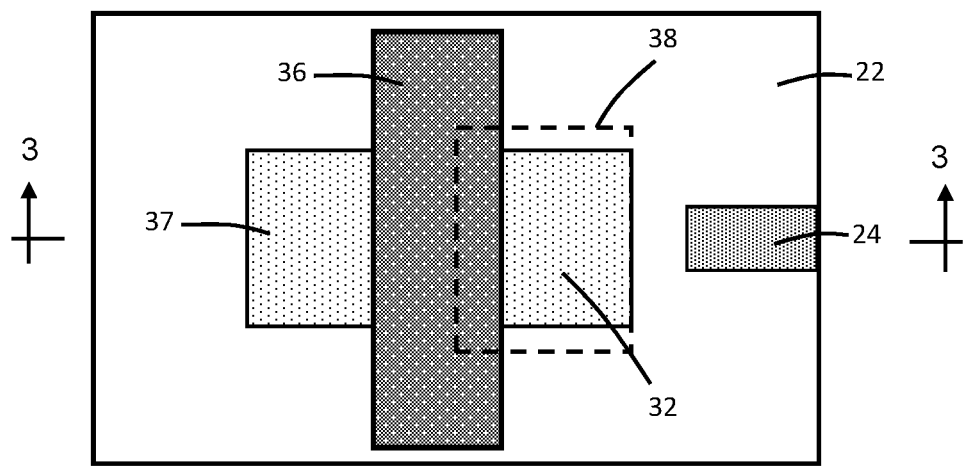

With reference to FIGS. 3, 3A in which like reference numerals refer to like features in FIG. 1 and at a subsequent fabrication stage, a device structure 34 is formed using the active device region 19 by front-end-of-line (FEOL) fabrication processing. In an embodiment, the device structure 34 may be a field-effect transistor provided as an active device in the active device region 19. The field-effect transistor providing the device structure 34 includes a gate electrode 36 and a gate dielectric 35 that may be formed by depositing a layer stack and patterning the layer stack with photolithography and etching. The gate dielectric 35 may be composed of a dielectric material, such as a high-k dielectric material like hafnium oxide ($HfO_2$). The gate electrode 36 may include one or more work function metal layers and/or conformal barrier metal layers, such as layers composed of titanium aluminum carbide (TiAlC) and/or titanium nitride (TiN), and a metal gate fill layer composed of a conductor, such as tungsten (W). The gate electrode 36 may include different combinations of the conformal work function metal layers and/or barrier metal layers. For example, the metal gate electrode may include conformal work function metal layers characteristic of an n-type field-effect transistor. The field-effect transistor providing the device structure 34 may include other structural elements, such as source/drain regions 37, 38, halo regions, and lightly doped drain (LDD) extensions in the active region, as well as non-conductive spacers formed on the vertical sidewalls of the gate electrode 36. In an embodiment, the field effect-transistor may be an n-type field-effect transistor in which the source/drain regions 37, 38 contain an n-type dopant (e.g., arsenic (As) and/or phosphorus (P)) producing n-type conductivity. As used herein, the term "source/drain region" connotes a doped region of semiconductor material that can function as either a source or a drain of a field-effect transistor.

The source/drain regions 37, 39 and the doped region 32 are doped such that the source/drain regions 37, 39 have an opposite conductivity type from the doped region 32. For example, if the source/drain regions 37, 39 have n-type conductivity, the doped region 32 has p-type conductivity. The source/drain region 38 is arranged in the active device region 19 over the doped region 32 and is separated in a vertical direction from the doped region 32 by the portion of the BOX layer 14 extending laterally between the trench isolation regions 18. In an embodiment, the source/drain region 38 may be a drain region of the device structure 34. In an embodiment, the doped region 32 may be larger in cross-sectional area than the source/drain region 38. Because a doped region similar to doped region 32 is absent beneath the source/drain region 37, the arrangement includes a single charge-carrier sink and is considered to be asymmetrical.

During high current drive operation of the device structure 34 at higher bulk-to-source voltages or power supply voltages, the doped region 32 may attract and sink charge accumulating in the blocked region 26 of the substrate 16 at and near the interface with the BOX layer 14. In an embodiment, the doped region 32 contains p-type semiconductor material and may sink negative charge carriers accumulating in the blocked region 26 of the substrate 16 at and near the interface between the BOX layer 14 and the substrate 16. The result is that the current drop associated with the charge accumulation during device operation may be reduced or eliminated.

Middle-of-line (MOL) and back-end-of-line (BEOL) processing follow, which includes formation of an interconnect structure (not shown) that includes one or more interlayer dielectric layers that are formed over the device structure 34 and metallization formed in the interlayer dielectric layers. Interconnects formed in the interconnect structure may be connected with the gate electrode 36 and source/drain regions 37, 38.

Figure 4:
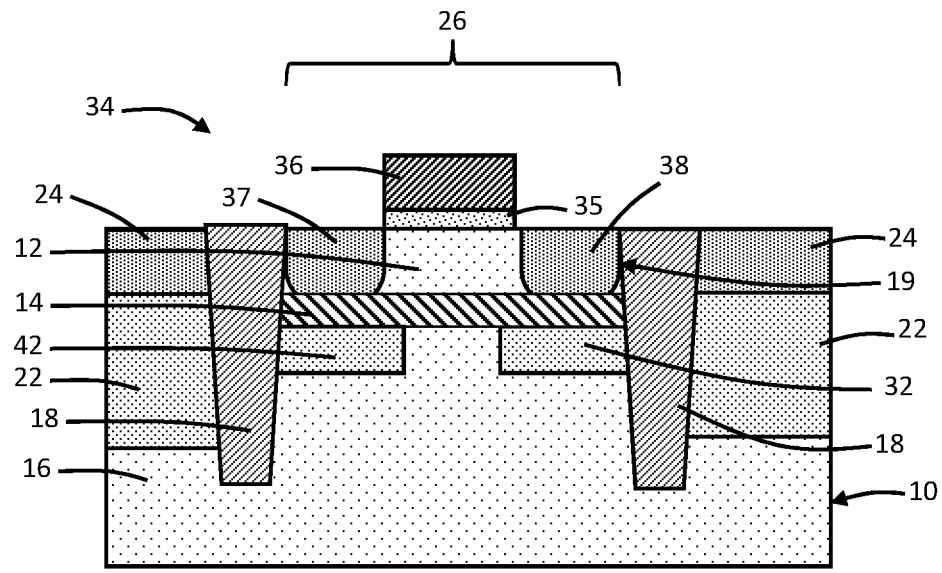
FIGS. 4 and 5 are cross-sectional views similar to FIG. 3 of structures in accordance with alternative embodiments of the invention.

With reference to FIG. 4 in which like reference numerals refer to like features in FIG. 3 and in accordance with alternative embodiments of the invention, the well 22 and well contact 24 may also be located on both sides of the active device region 19 outside of the trench isolation regions 18. A doped region 42 similar to the doped region 32 may be formed in the blocked region 26 of the substrate 16 beneath the active device region 19 and BOX layer 14. The doped region 42 may be formed by ion implantation concurrently with the doped region 32. To that end, the doped region 42 may be formed as described above for doped region 32 with the implantation mask 28 including an additional opening at the intended location for the doped region 42. The doped region 42 is arranged beneath the source/drain region 37, which may be the source region of the device structure 34. Both of the doped regions 32, 42 have the same conductivity type (e.g., p-type conductivity) and both of the source/drain regions 37, 38 have the opposite conductivity type (e.g., n-type conductivity). The resulting device structure 34 includes multiple doped regions 32, 42 with one of the doped regions 32 arranged beneath the source/drain region 38 and the other of the doped regions 42 arranged beneath the source/drain region 37, which results in a symmetrical arrangement of charge carrier sinks.

Figure 5:
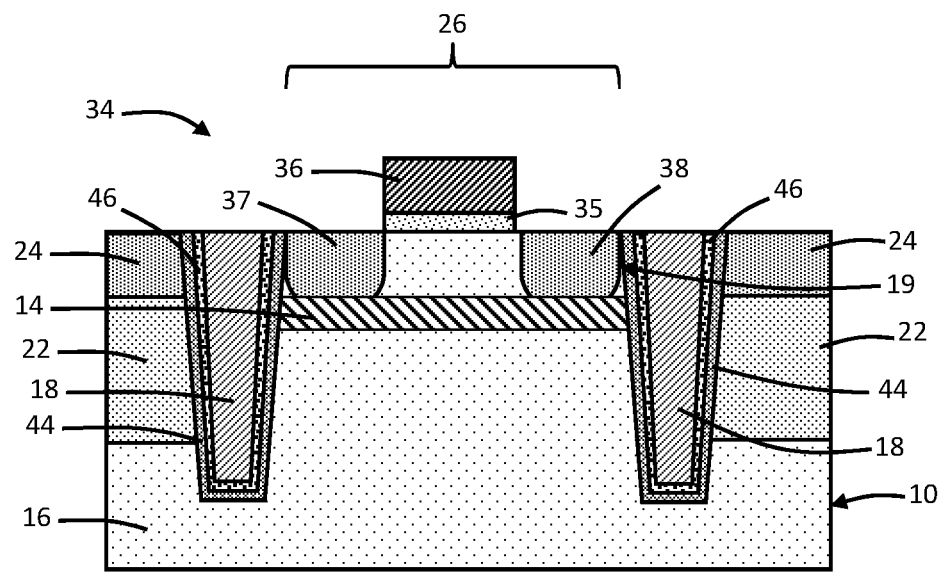

With reference to FIG. 5 in which like reference numerals refer to like features in FIG. 3 and in accordance with alternative embodiments of the invention, the dielectric material forming the trench isolation regions 18 may include a layer 46 of a doped dielectric material containing a dopant capable of enhancing the electrical conductivity of the substrate 16. In an embodiment, the dielectric material in the layer 46 may be a boron-doped silicate glass (BSG) that contains boron as the dopant. The layer 46 may be deposited in the trenches before the primary dielectric material fill is deposited.

Doped regions 44 are formed in the substrate 16 by the thermally-induced outward diffusion of dopant, e.g., boron, from the doped dielectric material in layer 46 of the trench isolation regions 18 into the substrate 16. The doped regions 44 surround the trench isolation regions 18. The doped regions 44, which are arranged in part in the blocked region 26 of the substrate 16, provide a functionality that is similar to the functionality of the doped regions 32, 44 by sinking charge accumulating in the substrate 16 beneath the BOX layer 14 during high current drive operation of the device structure 34. The doped regions 44 provide a path around the trench isolation regions 18 that is directly connected with the well 22, which may enhance the effectiveness of the charge dissipation by the doped regions 44 in comparison with the doped regions 32.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure formed using a silicon-on-insulator wafer, the structure comprising:
   a plurality of trench isolation regions extending through a device layer and a buried oxide layer of the silicon-on-insulator wafer into a substrate of the silicon-on-insulator wafer, the trench isolation regions arranged to surround an active device region of the device layer, and the active device region located over a portion of the buried oxide layer surrounded by the trench isolation regions;
   a well arranged in the substrate outside of the trench isolation regions, the well having a first conductivity type and a first electrical resistivity;
   a blocked region arranged in the substrate inside of the trench isolation regions and beneath the portion of the buried oxide layer, the blocked region having a second electrical resistivity that is greater than the first electrical resistivity; and
   a first doped region having the first conductivity type, the first doped region arranged in a first portion of the blocked region beneath the portion of the buried oxide layer and adjacent to one of the trench isolation regions,
   wherein the first doped region is more heavily doped with a dopant of the first conductivity type than the blocked region.

2. The structure of claim 1 further comprising:
   a field-effect transistor including a gate electrode over the active device region and a first source/drain region at least partially in the active device region,
   wherein the first source/drain region is arranged over the first doped region.

3. The structure of claim 2 wherein the field-effect transistor includes a second source/drain region at least partially in the active device region, and further comprising:
   a second doped region having the first conductivity type, the second doped region arranged in a second portion of the blocked region beneath the portion of the buried oxide layer and adjacent to another of the trench isolation regions.

4. The structure of claim 3 wherein the second source/drain region is arranged over the second doped region.

5. The structure of claim 2 wherein the first source/drain region is a drain of the field-effect transistor.

6. The structure of claim 2 wherein the first conductivity type is p-type electrical conductivity, and the first source/drain region has n-type electric conductivity.

7. The structure of claim 1 wherein the first doped region extends about an outer perimeter of the one of the trench isolation regions such that the first doped region is coupled with the well.

8. The structure of claim 1 wherein the trench isolation regions include a doped dielectric material.

9. The structure of claim 1 wherein the trench isolation regions include a boron-doped silicate glass.

10. The structure of claim 1 wherein the first doped region is completely separated from the active device region by the portion of the buried oxide layer extending between the trench isolation regions.

11. A method comprising:
    forming a plurality of trench isolation regions that extend through a device layer and a buried oxide layer of a silicon-on-insulator wafer into a substrate of the silicon-on-insulator wafer, wherein the trench isolation regions arranged to surround an active device region of the device layer, and the active device region is located over a portion of the buried oxide layer surrounded by the trench isolation regions;
    forming an implantation mask over the active device region;
    implanting the substrate with ions, with the implantation mask over the active device region and a blocked region in the substrate beneath the portion of the buried oxide layer, to form a well having a first conductivity type and a first electrical resistivity that is arranged in the substrate outside of the trench isolation regions; and
    forming a first doped region of the first conductivity type that is arranged in a first portion of the blocked region under the portion of the buried oxide layer and adjacent to one of the trench isolation regions,
    wherein the blocked region has a second electrical resistivity that is greater than the first electrical resistivity, and the first doped region is more heavily doped with a dopant of the first conductivity type than the blocked region.

12. The method of claim 11 further comprising:
    forming a gate electrode of a field-effect transistor including over the active device region; and
    forming a first source/drain region of the field-effect transistor at least partially in the active device region,
    wherein the first source/drain region is arranged over the first doped region.

13. The method of claim 12 further comprising:
    forming a second source/drain region of the field-effect transistor at least partially in the active device region; and
    forming a second doped region having the first conductivity type that is arranged in a second portion of the blocked region beneath the portion of the buried oxide layer and adjacent to another of the trench isolation regions.

14. The method of claim 13 wherein the second source/drain region is arranged over the second doped region.

15. The method of claim 12 wherein the first conductivity type is p-type electrical conductivity, and the first source/drain region has n-type electric conductivity.

16. The method of claim 11 wherein forming the trench isolation regions comprises:
    forming a plurality of trenches extending through the device layer and the buried oxide layer into the substrate; and
    depositing a doped dielectric material in the trenches.

17. The method of claim 16 wherein the doped dielectric material is a boron-doped silicate glass.

18. The method of claim 16 wherein a dopant in the doped dielectric material is thermally diffused from the trench isolation regions into the substrate of the silicon-on-insulator wafer to form the first doped region.

19. The method of claim 11 wherein the first doped region is completely separated from the active device region by the portion of the buried oxide layer extending between the trench isolation regions.

* * * * *